(12) United States Patent
Moore

(10) Patent No.: US 6,271,153 B1
(45) Date of Patent: Aug. 7, 2001

(54) SEMICONDUCTOR PROCESSING METHOD AND TRENCH ISOLATION METHOD

(75) Inventor: John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/603,848

(22) Filed: Jun. 26, 2000

Related U.S. Application Data

(62) Division of application No. 09/120,714, filed on Jul. 22, 1998, now abandoned.

(51) Int. Cl.$^7$ ................................................ H01L 21/469
(52) U.S. Cl. ..................... 438/787; 438/783; 438/763; 438/795; 438/437
(58) Field of Search .................................... 438/424, 435, 438/437, 585, 795, 763, 783, 787

(56) References Cited

U.S. PATENT DOCUMENTS

| 5,132,244 | 7/1992 | Roy . | |
|---|---|---|---|
| 5,217,912 | * 6/1993 | Ayukawa et al. . | |
| 5,258,333 | * 11/1993 | Shappir et al. | 148/DIG. 112 |
| 5,591,681 | * 1/1997 | Wristers et al. | 257/325 |
| 5,811,346 | * 9/1998 | Sur et al. | 438/424 |
| 5,994,756 | * 11/1999 | Umezawa et al. | 257/510 |

FOREIGN PATENT DOCUMENTS

| 1-2466860 | 10/1989 | (JP) . |
|---|---|---|
| 1-246860 | 10/1989 | (JP) . |
| 7-245267 | 9/1995 | (JP) . |

* cited by examiner

*Primary Examiner*—Trung Dang
(74) *Attorney, Agent, or Firm*—Wells, St. John, Roberts, Gregory & Matkin P.S.

(57) ABSTRACT

The invention includes semiconductor processing methods, including trench isolation. In one implementation, an oxide layer is deposited over a substrate. The deposited oxide layer is exposed to a chlorine containing gas effective to getter metals outwardly therefrom. In one implementation, a dielectric layer, for example silicon dioxide, is plasma enhanced chemical vapor deposited over a substrate within a chamber comprising an internal metal surface under conditions effective to incorporate metal from the chamber surface within the dielectric layer. The dielectric layer is then exposed to a chlorine containing gas effective to getter at least some of said metal outwardly therefrom. In one implementation, a trench isolation method comprises forming a series of isolation trenches into a semiconductive substrate. Silicon dioxide is chemical vapor deposited to within the trenches, with the silicon dioxide comprising metal impurity therein. The silicon dioxide within the trenches is densified using an atmosphere comprising chlorine which is effective to remove metal impurity from the silicon dioxide. In one implementation, some dielectric isolation material is chemical vapor deposited to within the trenches. After the chemical vapor deposition, the substrate is exposed to oxidation conditions effective to oxidize the trench sidewalls, with most preferably there having been no dedicated trench sidewall oxidation step conducted prior to the chemical vapor depositing.

12 Claims, 3 Drawing Sheets

SEMICONDUCTOR PROCESSING METHOD AND TRENCH ISOLATION METHOD

RELATED PATENT DATA

This patent resulted from a divisional application of U.S. patent application Ser. No. 09/120,714, which was filed on Jul. 22, 1998.

TECHNICAL FIELD

This invention relates to semiconductor processing methods, such as trench isolation methods.

BACKGROUND OF THE INVENTION

Integrated circuitry is typically fabricated on and within semiconductor substrates, such as bulk monocrystalline silicon wafers. To aid in interpretation of the claims that follow, the term "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductor substrates described above.

Electric components fabricated on substrates, and particularly bulk semiconductor wafers, are isolated from adjacent devices by insulating materials, such as silicon dioxide. One isolation technique uses shallow trench isolation, whereby trenches are cut into a substrate and are subsequently filled with an insulating material, such as, for example, silicon dioxide. In the context of this document, "shallow" shall refer to a distance of no greater than about 1 micron from an outermost surface of the substrate material within which an isolation region is received.

Prior art methods for forming trench isolation regions typically initially deposit a pad oxide layer and a silicon nitride layer over a semiconductive substrate. The substrate typically comprises a monocrystalline silicon wafer lightly doped with a p- type background dopant material. A photoresist layer is deposited onto the silicon nitride, and is processed to define desired trench shaped openings within the photoresist over the silicon nitride. Suitable etching steps are then conducted to etch trenches through the silicon nitride and pad oxide layer into the bulk monocrystalline silicon substrate, thus defining trenches which will be utilized for isolating various active regions on the substrate.

The photoresist is then stripped from the substrate, and the wafer is subjected to appropriate thermal oxidation conditions to oxide the substrate sidewalls within the trenches. One purpose of this oxidation is to round the bottom corners of the trenches to reduce stress at these corners during subsequent processing.

After sidewall oxidation, the trenches are typically filled with a dielectric material, such as by high density plasma chemical vapor deposition of an undoped oxide. Such deposition typically is conducted within a processing furnace having internal metal walls. Apparently, some of the metal from these chamber walls gets displaced, and ends up being deposited in the oxide on the substrate. The metals typically include one or more of aluminum, molybdenum, iron or chromium. Contamination concentration is typically on the order of $1 \times 10^{11}$ atoms/cm$^3$. Presence of these metals in the finished product adversely affects device performance, such as creating refresh problems in DRAM circuitry and otherwise adversely impacting leakage characteristics of transistors formed within the active areas.

The high density plasma deposited oxide is typically not suitably dense as deposited. Accordingly in the prior art, it is subjected to a densification step at, for example, from about 800° C. to 1000° C. for 30 minutes in a chemically inert atmosphere. This causes the deposited oxide to densify and shrink to achieve desirable densification. Unfortunately, the deposited oxide and thermal oxide lining the trench sidewalls densify or shrink at different rates. This undesirably imparts stress into the deposited oxide layer and underlying substrate which also can have an adverse effect on the finished circuitry.

SUMMARY OF THE INVENTION

The invention includes semiconductor processing methods, including trench isolation. In one implementation, an oxide layer is deposited over a substrate. The deposited oxide layer is exposed to a chlorine-containing gas effective to getter metals outwardly therefrom. In one implementation, a dielectric layer, for example silicon dioxide, is plasma enhanced chemical vapor deposited over a substrate within a chamber comprising an internal metal surface under conditions effective to incorporate metal from the chamber surface within the dielectric layer. The dielectric layer is then exposed to a chlorine-containing gas effective to getter at least some of said metal outwardly therefrom. In one implementation, a trench isolation method comprises forming a series of isolation trenches into a semiconductive substrate. Silicon dioxide is chemical vapor deposited to within the trenches, with the silicon dioxide comprising metal impurity therein. The silicon dioxide within the trenches is densified using an atmosphere comprising i chlorine which is effective to remove metal impurity from the silicon dioxide. In one implementation, some dielectric isolation material is chemical vapor deposited to within the trenches. After the chemical vapor deposition, the substrate is exposed to oxidation conditions effective to oxidize the trench sidewalls, with most preferably there having been no dedicated trench sidewall oxidation step conducted prior to the chemical vapor depositing.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
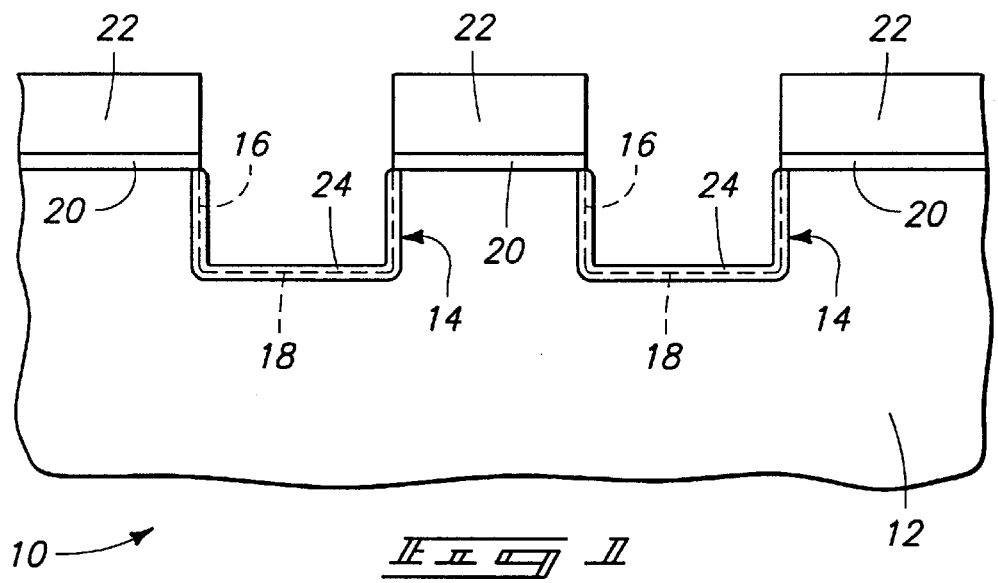
FIG. 1 is a diagrammatic sectional view of a semiconductor wafer fragment at one processing step in accordance with the invention.

Referring to FIG. 1, a semiconductor wafer fragment in process in indicated generally with reference numeral 10 and comprises a bulk monocrystalline silicon substrate 12. A series of isolation trenches 14 are formed into semiconductive substrate 12. As deposited, isolation trenches 14 have sidewalls 16 and a base wall 18. A pad oxide layer 20 and silicon nitride layer 22 is formed over semiconductive substrate 12, with trenches 14 having been cut therethrough. The substrate is then subjected to suitable oxidation conditions to thermally grow oxide layers 24 over or relative to trench sidewalls 16 and trench bases 18.

Figure 2:
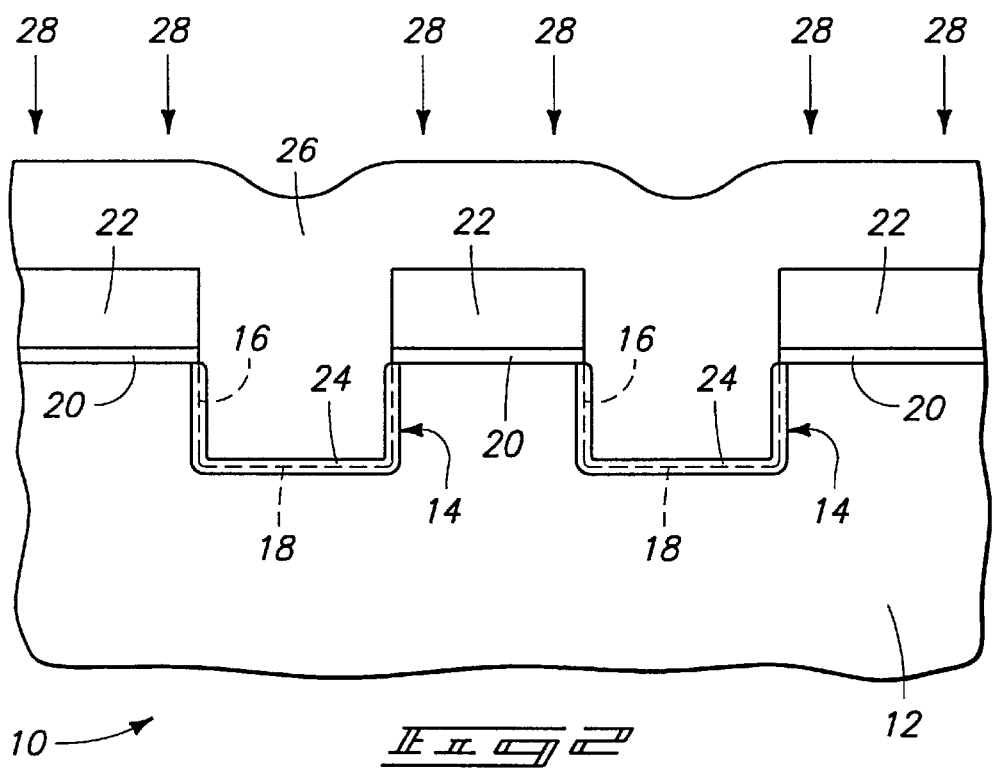
FIG. 2 is a view of the FIG. 1 wafer at a processing step subsequent to that shown by FIG. 1.

Referring to FIG. 2, a dielectric layer 26 is deposited over substrate 12 to within trenches 14. Preferred deposited material is undoped silicon dioxide deposited by high density plasma enhanced chemical vapor deposition. In the context of this document, "undoped" is defined as having less than 0.1% molar of conductivity enhancing dopant therein. When deposited within a chamber comprising internal metal surfaces, typical deposition conditions are unfortunately effective to remove metal from such sidewalls and incorporate such metal from the chamber surface to within deposited layer 26. Undesired metal impurity might also be incorporated within layer 26 in some other manner, such as inherent in the deposition process independent of the type of chamber being utilized.

Deposited dielectric layer 26 is exposed to a chlorine-containing gas (indicated by arrows 28) effective to getter metals, such as metal impurity, outwardly therefrom. Most preferably, the exposing also constitutes conditions effective to densify the deposited dielectric layer within the trenches to a more dense condition than the as-deposited state. Accordingly, with the most preferred embodiment of the invention, the prior art dry/inert densification of the high density plasma deposited oxide layer is substituted with a densification process at least including a chlorine gas, and most preferably also constituting hydrogen and oxygen (i.e., $H_2$ and $O_2$) to provide wet densification conditions. The chlorine-containing gas can be provided to the substrate in any suitable manner, with a preferred method comprising bubbling a gas into an organic chlorine compound containing liquid and providing the bubbled gas to proximate the dielectric layer on the substrate within a chamber. Example preferred chlorine-containing compounds comprise dichloroethylene, trichloroethane, and HCl. Example specific chlorine precursors comprise Trans LC™ available from ADCS Inc. of Burnet, Tex., and TCA™ available from the J.C. Schumacher Company of Oceanside, Calif. Gaseous metal chlorides are most likely formed from the chlorine containing gas and metals displaced from the deposited layer.

The exposure and densification conditions preferably comprise from about 750° C. to about 1000° C. at a pressure greater than about 600 Torr, and most preferably at or around atmospheric pressure. Most preferably, the exposing and/or densification occurs prior to any deposition of any metal layer over the substrate to prevent the chlorine-containing gas from attacking such previously deposited metal. Example gases for bubbling through the organic chlorine compound containing liquid are inert gases, such as $N_2$ and Ar. More preferably, the gas bubbled into the liquid comprises an oxygen containing compound, such as $O_2$ and/or $O_3$. Bubbling an oxygen containing compound gas through certain organic chlorine containing compound liquids can oxide material therein to produce $CO_2$, $H_2O$ and $Cl^-$, potentially making more chlorine available for gettering metal from the deposited dielectric layer. Regardless, the chlorine-containing liquid precursor is preferably heated to a range from about 20° C. to about 30° C. during the bubbling, with the bubbling gas flow being at an exemplary rate from about 10 sccm to about 300 sccm for from about 5 minutes to 30 minutes.

The preferred additional feed of $H_2$ and $O_2$ during the chlorine exposure and densification preferably ranges from about 1:1 to about 1:4, respectively by volume.

Figure 3:
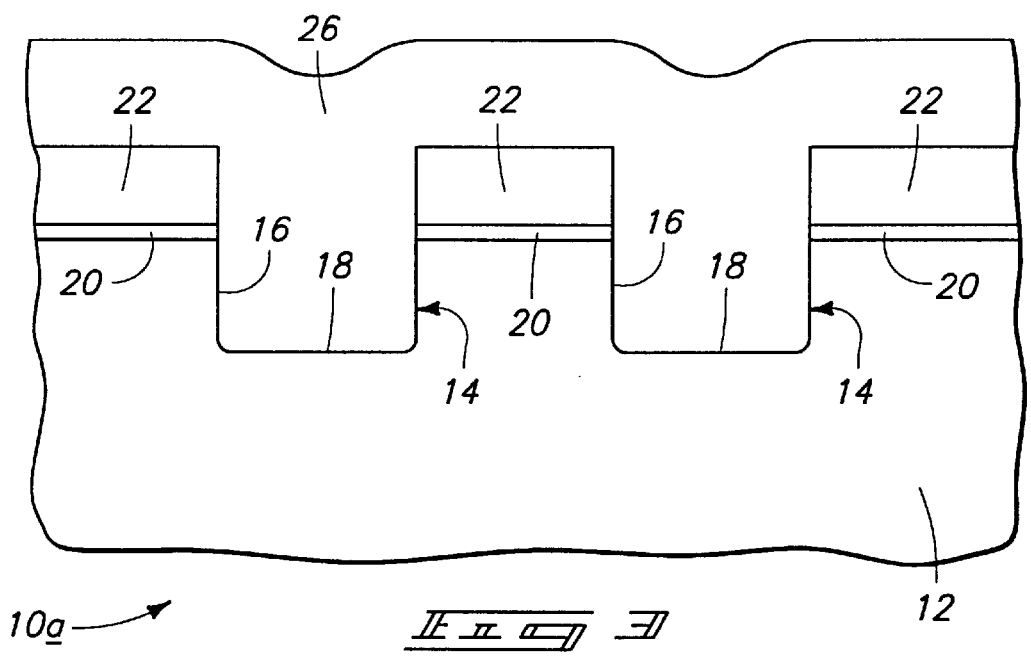
FIG. 3 is a diagrammatic sectional view of an alternate embodiment semiconductor wafer fragment at a processing step in accordance with the invention.

Another embodiment in accordance with the invention is described with reference to FIGS. 3 and 4. Like numerals from the first described embodiment are utilized where appropriate, with differences being indicated with a suffix "a" or with different numerals. With substrate 10a, a series of isolation trenches 14 have been formed into semiconductive substrate 12 having initial sidewalls 16 and bases 18. The dielectric isolation material layer 26 is chemical vapor deposited to within the trenches.

Figure 4:
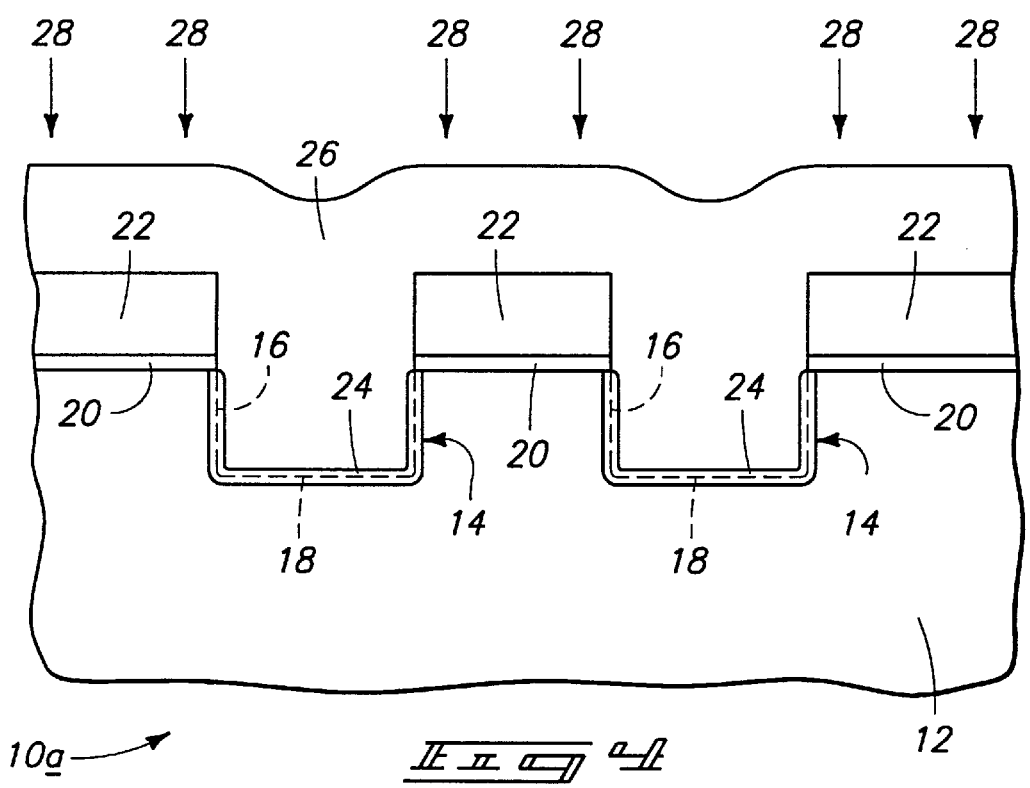
FIG. 4 is a view of the FIG. 3 wafer at a processing step subsequent to that shown by FIG. 3.

Referring to FIG. 4 and after the chemical vapor depositing, the substrate is exposed to oxidizing conditions effective to oxidize trench sidewalls 18 and form oxidation layer 24. Most preferably, processing of wafer 10 to this point has been void of any dedicated trench sidewall oxidation step prior to the chemical vapor depositing of layer 26. Prior art processing in this regard has never before been understood to appreciably 11 oxidize the sidewalls of isolation trenches after deposition of the trench-filling dielectric material. Preferably in accordance with the above-described first embodiment, the isolation material is exposed to conditions effective to getter metal therefrom after the chemical vapor depositing of layer 26, such as for example by utilizing a chlorine-containing gas in accordance with the first described embodiment. Most preferably, the exposing to getter and the exposing to oxidize the sidewalls occur in the same/common processing step, for example utilizing the processing and parameters as described above. With high density plasma deposited oxide, a processing temperature of at least 950° C. (and preferably less than or equal to about 1100° C.) might be most desirable to assure achieving all of the sidewall oxidation, metal gettering, and densification of layer 26. The preferred densification/sidewall oxidation after the dielectric layer deposition will also be wet, for example using added feed gases of $H_2$ and $O_2$. A more $H_2$ rich ambient than the above described first embodiment is preferred, for example using a volumetric ratio of $H_2:O_2$ from about 1.25:1 to 1:2. Sidewall oxide growth after deposition and during densification can relieve stress over the prior art, and may be used to possibly eliminate a separate processing step.

Subsequent processing in accordance with the first and second described embodiments would typically include a suitable planarization step of layer 26, and ultimate stripping of nitride layer 22 and pad oxide layer 20 to form the desired isolation trenches. Subsequent processing would form circuit devices and typically form doped and other oxide and dielectric layers over the substrate.

Figure 5:
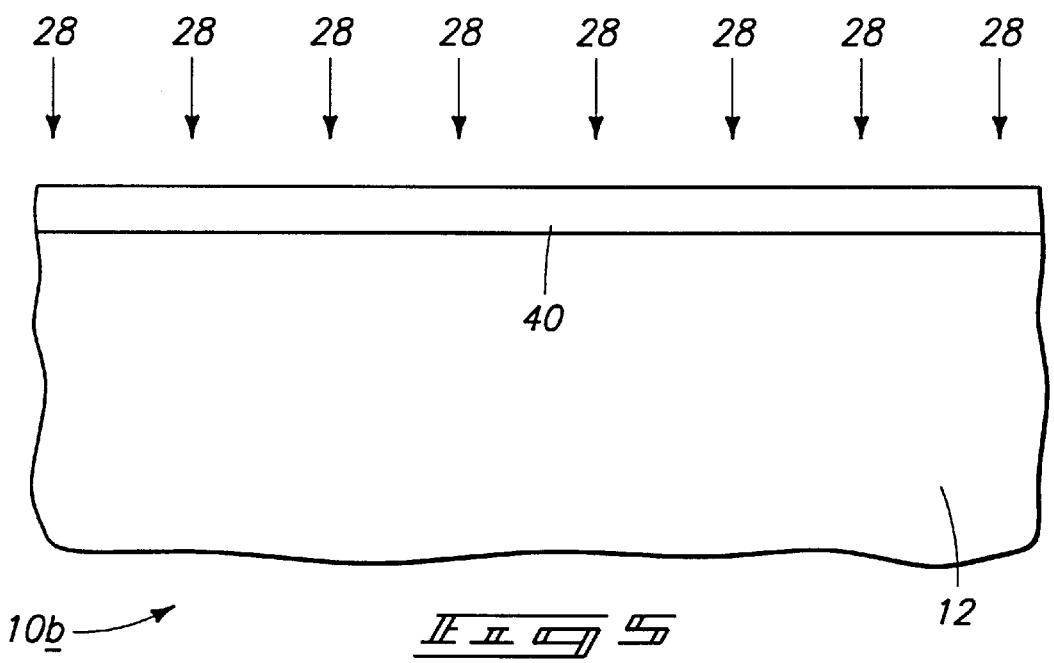
FIG. 5 is a diagrammatic sectional view of another alternate embodiment semiconductor wafer fragment at a processing step in accordance with the invention.
Figure 6:
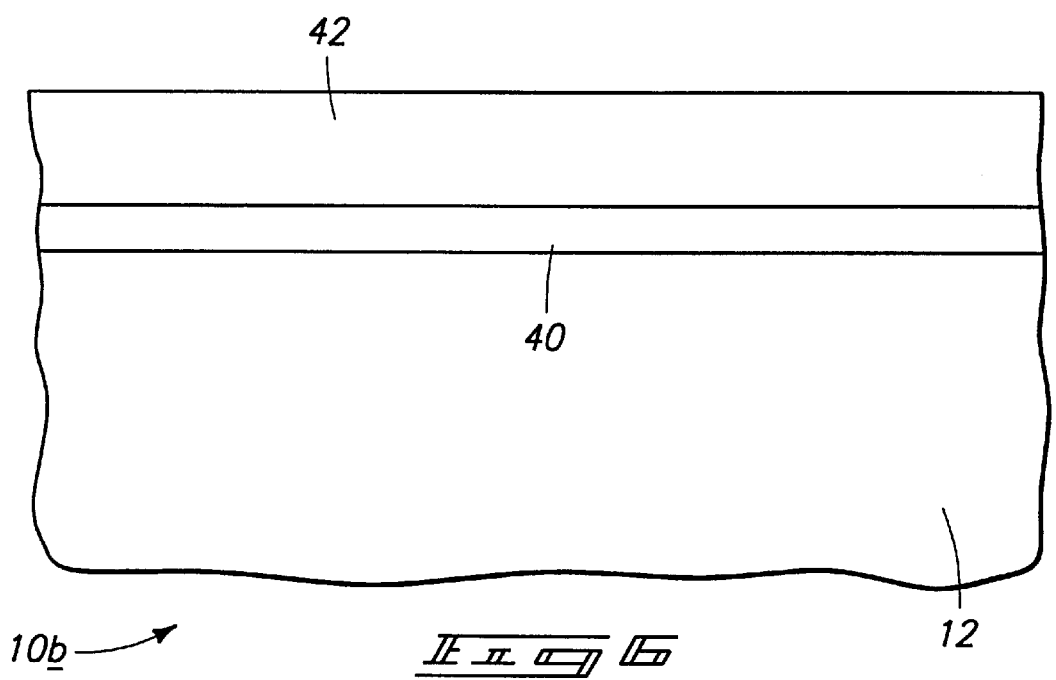
FIG. 6 is a view of the FIG. 5 wafer at a processing step subsequent i to that shown by FIG. 5.

Another alternate embodiment is described with references to FIGS. 5 and 6. Like numerals from the first-described embodiment have been utilized where appropriate, with differences being indicated by the suffix "b", or with different numerals. FIG. 5 depicts a semiconductor wafer fragment 10b comprised of a bulk monocrystalline silicon substrate 12. An undoped oxide layer 40 has been deposited over substrate 12. By way of example only, such layer might be deposited by decomposition of tetraethylorthosilicate (TEOS). The deposited undoped oxide layer 40 is densified in a chlorine-containing atmosphere, such as that described above and under similar conditions, as depicted by arrows 28.

Referring to FIG. 6 and after the densifying, a doped oxide layer 42 is formed over undoped oxide layer 40. An example material is borophosphosilcate glass (BPSG). After depositing doped oxide layer 40, it can be densified or otherwise exposed to a chlorine-containing atmosphere. Such processing might be utilizable apart from shallow trench isolation formation, such as relative to interlevel dielectric layer processing. Again however most preferably, no metal layer will have been deposited on the wafer prior to such chlorine atmosphere processing to avoid risk of attack of such metal by the chlorine atmosphere, even through previously deposited layers.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
    depositing an undoped oxide layer over a substrate;
    densifying the deposited undoped oxide layer in a chlorine containing atmosphere; and
    after said densifying, forming a doped oxide layer over the undoped oxide layer.

2. The method of claim 1 wherein the undoped and doped oxide layers are formed by chemical vapor depositing.

3. The method of claim 1 wherein the undoped oxide layer is deposited by decomposition of TEOS and the doped oxide layer comprises BPSG.

4. The method of claim 1 comprising, after depositing the doped oxide layer, densifying the doped oxide layer in a chlorine containing atmosphere.

5. The method of claim 1 wherein the densifying atmosphere also comprises hydrogen and oxygen.

6. The method of claim 1 wherein the densifying occurs prior to any deposition of any metal layer over the substrate.

7. The method of claim 1 wherein the densifying comprises bubbling a gas into an organic chlorine compound containing liquid and providing the bubbled gas proximate the oxide layer.

8. The method of claim 7 wherein the gas bubbled into the liquid comprises an oxygen containing compound.

9. The method of claim 7 wherein the gas bubbled into the liquid comprises $O_2$.

10. The method of claim 7 wherein the chlorine containing compound comprises a dichloroethylene.

11. The method of claim 7 wherein the chlorine containing compound comprises a trichloroethane.

12. The method of claim 7 wherein the chlorine containing compound comprises HCl.

\* \* \* \* \*

UNITED STATES PATENT AND TRADEMARK OFFICE
CERTIFICATE OF CORRECTION

PATENT NO. : 6,271,153 B1
DATED : August 7, 2001
INVENTOR(S) : John T. Moore

It is certified that error appears in the above-identified patent and that said Letters Patent is hereby corrected as shown below:

<u>Column 2,</u>
Line 33, delete "i".
Line 60, delete "i".

<u>Column 4,</u>
Line 24, delete "11".

Signed and Sealed this

Ninth Day of April, 2002

Attest:

Attesting Officer

JAMES E. ROGAN
*Director of the United States Patent and Trademark Office*